United States Patent [19]

Mensz

[11] Patent Number: 5,544,190
[45] Date of Patent: Aug. 6, 1996

[54] II-VI SEMICONDUCTOR DIODE LASER WITH LATERAL CURRENT CONFINEMENT

[75] Inventor: Piotr M. Mensz, Ossining, N.Y.

[73] Assignee: Phillips Electronics North America Corporation, New York, N.Y.

[21] Appl. No.: 343,700

[22] Filed: Nov. 17, 1994

[51] Int. Cl.$^6$ ..................................................... H01S 3/19
[52] U.S. Cl. ................................................. 372/46; 372/45
[58] Field of Search .......................... 372/46, 45; 257/81, 257/773

[56] References Cited

U.S. PATENT DOCUMENTS

| | | | |
|---|---|---|---|
| 4,454,603 | 6/1984 | Marschall et al. | 372/46 |
| 4,856,013 | 8/1989 | Iwano et al. | 372/45 |
| 5,036,522 | 7/1991 | Tanguy et al. | 372/46 |
| 5,081,632 | 1/1992 | Migita et al. | 372/45 |
| 5,213,998 | 5/1993 | Qui et al. | 437/185 |
| 5,363,395 | 11/1994 | Gaines et al. | 372/45 |
| 5,373,521 | 12/1994 | Takahashi | 372/46 |

FOREIGN PATENT DOCUMENTS

| | | |
|---|---|---|
| 0346120 | 12/1989 | European Pat. Off. . |
| 3406361 | 8/1985 | Germany . |
| 63-44786 | 2/1988 | Japan . |
| 1-218086 | 8/1989 | Japan . |

Primary Examiner—Rodney B. Bovernick
Assistant Examiner—Yisun Song
Attorney, Agent, or Firm—Steven R. Biren

[57] ABSTRACT

A II-VI semiconductor diode laser has a II-VI semiconductor structure disposed atop a semiconductor substrate and covered with a contact layer. A current-blocking layer is disposed on top of this contact layer. The current-blocking layer has an etched groove extending therethrough, to expose a stripe of the contact layer. A metal electrode layer contacts the current-blocking layer and extends into the etched groove to contact the exposed stripe of the contact layer. The current-blocking layer confines the current flow between the metal electrode layer and the contact layer to the stripe of the contact layer exposed by the etched groove.

15 Claims, 1 Drawing Sheet

II-VI SEMICONDUCTOR DIODE LASER WITH LATERAL CURRENT CONFINEMENT

FIELD OF THE INVENTION

The invention relates to II-VI semiconductor diode lasers, and in particular to a II-VI semiconductor diode laser having a II-VI semiconductor current-blocking layer for current confinement.

BACKGROUND OF THE INVENTION

Presently, most commercially-available semiconductor diode lasers are fabricated of III-V compound semiconductors and their alloys. Such semiconductor diode lasers, which emit light in the infrared and red portions of the spectrum, are used inter alia as components in read and/or write heads of information processing equipment such as laser printers, bar code readers, and read and/or write devices for optical registration carriers such as CD and CD-ROM discs, and as transmitters in systems for optical glass fiber communication. In the latter systems, the semiconductor diode laser may also be used as a light amplifier, and in this application the term "laser" is meant to include such light amplifiers.

However, there are many applications for which the wavelength of light generated by infrared and red diode lasers is not suitable. Other types of semiconductor diode lasers, such as II-VI semiconductor diode lasers which emit light at shorter wavelengths, such as the green and blue portions of the spectrum, would accordingly be desirable. These semiconductor diode lasers would also increase the performance and capabilities of many systems which currently use infrared and red semiconductor diode lasers.

Contacts for applying a current to a semiconductor diode laser, whether of the III-V or II-VI type, are normally formed by electrode layers on both sides of the laser. These electrode layers preferably have a large surface area to allow for dissipation of heat which is generated during operation. However, current flow through the diode laser is desired only over a much smaller active area. Various techniques are known to adequately confine the current flow through semiconductor diode lasers, as shown for example in U.S. Pat. Nos. 4,454,603 and 5,213,998; Japanese Patents Nos. 1-218086 and 63-44786; and German Patent Application No. DE 3406361 A1.

Previously-known II-VI semiconductors diode lasers typically use polyimide or other dielectric materials to confine the current flow. This confinement of the current flow between the electrode layer and the contact layer is achieved in the prior art by a current-blocking layer of polyimide or other dielectric material which covers the contact layer and exposes only a small area of the contact layer through an opening. The electrode layer and the contact layer contact each other through this opening. The current flow between the electrode layer and the contact layer will thus only occur through the opening in the current-blocking layer, and will be blocked in the other areas where the current-blocking layer is present between the contact layer and the electrode layer. Due to the high temperatures, typically in the order of 300° C.–400° C., involved in the manufacture of II-VI semiconductor diode lasers having current-blocking layers of polyimide or other dielectric material, the prior art diode lasers are subject to degradation in the laser structure. This degradation can lead to operational failure, or a lasing action of lower quality or reliability.

SUMMARY OF THE INVENTION

It is therefore an object of the present invention to obtain an adequate current flow confinement in a II-VI semiconductor diode laser without causing degradation as in prior art laser structures.

It is a further object of the invention to provide a II-VI semiconductor diode laser having an adequate current confinement without the need for a polyimide or other dielectric layer that would require high temperatures in the manufacturing process.

It is yet a further object of the invention to provide a II-VI semiconductor diode laser having an adequate confinement that is easy and inexpensive to produce.

These and other objects of the invention are realized in the present invention by confining the current flow to a stripe of the contact layer which is exposed by a groove etched through a II-VI semiconductor current-blocking layer disposed atop the contact layer. The II-VI semiconductor blocking layer is preferably grown in-situ using the same process used to form the contact layer, since this simplifies the manufacturing process. A metal electrode layer contacting the current-blocking layer will extend into the groove to contact the stripe of the contact layer. Due to this unique structure, a layer of polyimide or other dielectric is no longer needed to achieve the required current confinement.

In a first embodiment of the invention the current-blocking layer has a conductivity type opposite to that of the conductivity type of the contact layer. The groove in this first embodiment is etched through the current-blocking layer just to the contact layer. In operation, current flow between the metal electrode layer and the contact layer will only occur in the groove area, since no current flow can occur through the current-blocking layer because it forms a Schottky barrier with the metal electrode layer and a reverse-biased p-n junction with the contact layer.

In a second embodiment of the invention, the groove extends into the contact layer. The layer structure in this embodiment is the same as in the first embodiment. The groove preferably has curved edges to avoid high current densities that normally occur at sharp edges.

In a further embodiment of the invention the current-blocking layer is undoped, and the current flow between the metal electrode layer and the contact layer through the current-blocking layer will be prevented because of the Schottky barrier which is present between the metal electrode layer and the current-blocking layer. The current flow will thus only occur through the groove area where the contact layer and the metal electrode layer actually contact each other.

The temperatures involved in the manufacture of a II-VI semiconductor diode laser with the II-VI semiconductor current-blocking layer according to this invention are much lower than those involved in the processes previously used to manufacture II-VI semiconductor diode lasers with current-blocking layers of polyimide or other dielectrics, since the temperature during etching is typically in the order of 80° C.–90° C., the temperature needed for photoresist baking. Due to the lower temperatures the degradation of the laser structure is lessened, resulting in a higher quality and more reliable II-VI semiconductor diode laser.

BRIEF DESCRIPTION OF THE DRAWING

The invention may be more completely understood with reference to the following detailed description, to be read in conjunction with the accompanying drawing, in which.

It should be noted that the figures are not drawn to scale, certain dimensions being exaggerated for greater clarity. In the Figures, like reference numerals are used to describe like regions.

DESCRIPTION OF THE PREFERRED EMBODIMENTS

Figure 1:
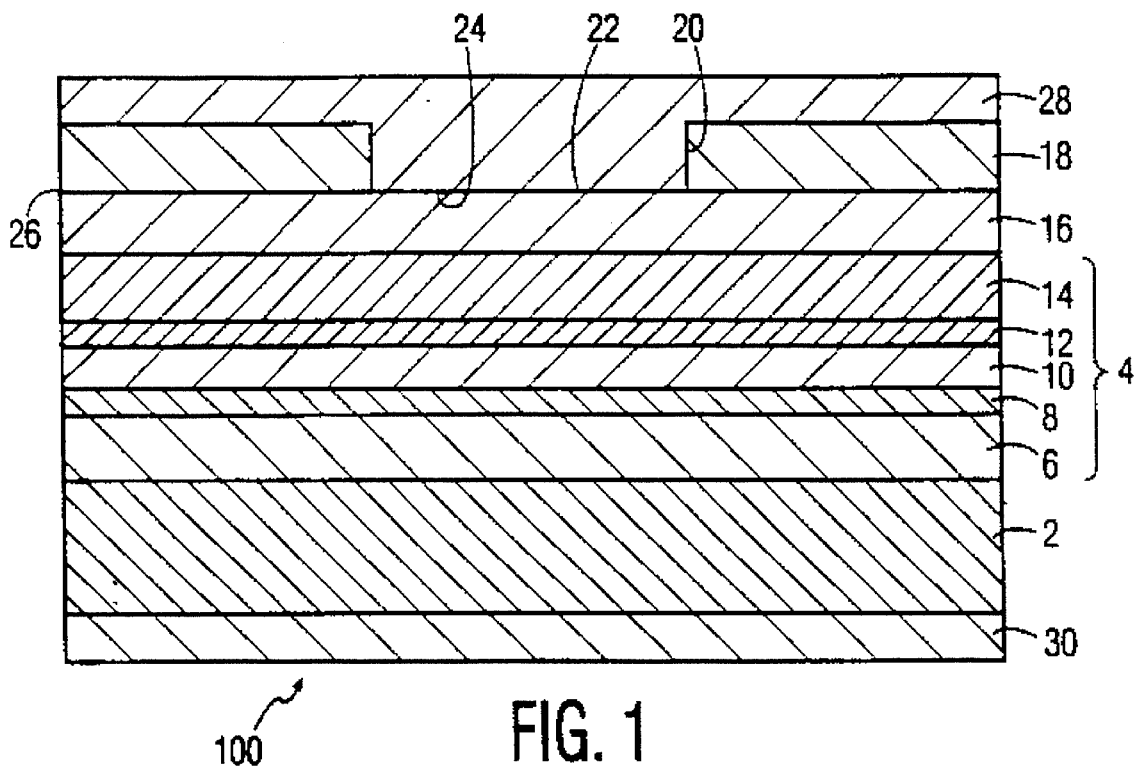
FIG. 1 is a cross-sectional view illustrating a first embodiment of a II-VI semiconductor diode laser which includes a II-VI semiconductor current-blocking layer and an etched groove in accordance with the invention.

Turning now to FIG. 1, there is shown a cross-section of a II-VI semiconductor diode laser 100 according to a first embodiment of the invention, having a substrate 2 of a first conductivity type, here a (001) oriented, n-type GaAs (III-V semiconductor material) substrate having a doping concentration in the order of $10^{18}$ at/cm$^3$. On top of this substrate 2 a semiconductor layer structure 4 is disposed, with an active layer 10 situated between two wave guiding layers 8, 12 and two cladding layers 6, 14. A first cladding layer 6, of II-VI semiconductor material of the same conductivity type as the substrate 2, is disposed atop the substrate 2. In this example the first cladding layer 6 is an n-type ZnMgSSe layer with a doping concentration in the order of $10^{17}$ at/cm$^3$. The thickness of this first cladding layer 6 is typically about 2 microns.

A first wave guiding layer 8, of II-VI semiconductor material of the same conductivity type as the first cladding layer 6, is disposed atop the first cladding layer 6. Here, the first wave guiding layer 8 is an n-type ZnSSe having a doping concentration in the order of $10^{17}$ at/cm$^3$. The thickness of this first wave guiding layer 8, which is typically between 500 Å and 5000 Å, is 2500 Å in this example.

An active layer 10 of II-VI semiconductor material is disposed atop the first waveguiding layer. Here the active layer is a single layer of ZnCdSe having a thickness in the order of 65 Å. The active layer 10 can also be a multilayer active layer, in which case active layer portions are spaced apart by spacers of, for example, the same material as the guiding layer. These spacers typically have a thickness between 100 Å and 200 Å. A second wave guiding layer 12 of II-VI semiconductor material of a second conductivity type opposite to the conductivity type of the first waveguiding layer 8 is disposed on top of the active layer 10. Here the second wave guiding layer is of p-type ZnSSe having a doping concentration in the order of $10^{17}$ at/cm$^3$ and a thickness which is typically between 500 Å and 5000 Å.

A second cladding layer 14, of the second conductivity type, is disposed atop this second waveguiding layer 12. Here the second cladding layer 14 is of p-type ZnMgSSe having a doping concentration in the order of $10^{17}$ at/cm$^3$ and a thickness of about 1 micron. A contact layer 16 of II-VI semiconductor material of the second conductivity type is provided on top of the second cladding layer 14, as shown in FIG. 1. This contact layer 16 can, for example, be of p-type ZnSe having a doping concentration in the order of $10^{18}$ at/cm$^3$ and a thickness of 0.1 micron. The layers 6–16 can be grown epitaxially on the substrate 2 by techniques well known to those skilled in the art, such as Molecular Beam Epitaxy.

A current-blocking layer 18 of II-VI semiconductor material is formed on top of contact layer 16. The current-blocking layer 18 can, for example, be an n-type ZnSe current-blocking layer having a doping on the order of $10^{15}$ at/cm$^3$, and a thickness of 0.2 micron. To simplify the manufacture of the semiconductor diode laser, the current-blocking layer 18 can be grown in situ using the same process used in the formation of layers 6–16.

The current-blocking layer 18 is provided with a groove 20, which may for example be stripe-shaped, and which is etched through the current-blocking layer 18 using photoresist and etching techniques. The groove may be made by applying a photoresist mask (not shown) to the surface of the current-blocking layer 18, the mask being provided with a stripe-shaped opening in a conventional manner, in order to permit etching of a groove through the current-blocking layer 18. The stripe-shaped opening has, for example, a width of 10 microns, which defines the lateral dimension of the laser cavity. At the bottom 22 of the groove 20 a stripe 24 of the contact layer 16 is exposed. As is shown in FIG. 1 the bottom 22 of the groove can be positioned in the same plane as the interface 26 between the contact layer 16 and the current-blocking layer 18. During etching the laser structure will not be subject to temperatures higher than about 80° C.–90° C. the temperature needed for the photoresist baking. Such lower temperatures will not cause the degradation in the laser structure that typically occurs in the manufacture of known II-VI semiconductor diode lasers.

A metal electrode layer 28 is disposed on top of the current-blocking layer 18, for example by evaporation. The metal electrode layer may be, for example, Au or Pt. The metal electrode layer 28 not only contacts the current-blocking layer 18, but also extends into the groove 20 to contact the exposed stripe 24 of the contact layer 16. Though it will be clear that this metal electrode layer 28 need not extend over the entire area of the current-blocking layer 18, a relatively large area of coverage provides for increased dissipation of heat and simplifies the manufacture of the semiconductor diode laser. A second metal electrode layer 30 is provided in the usual manner at the bottom of the substrate 2 of the semiconductor diode laser 100.

During operation of the laser structure the current flow between the metal electrode layer 28 and the contact layer 16 will be confined to the area of the groove in the current-blocking layer 18, because the Schottky barrier between the current-blocking layer 18 and the metal electrode layer 28 and the reverse-biased p-n junction between the current-blocking layer 18 and the contact layer 16 prevent current flow through the current-blocking layer.

Figure 2:
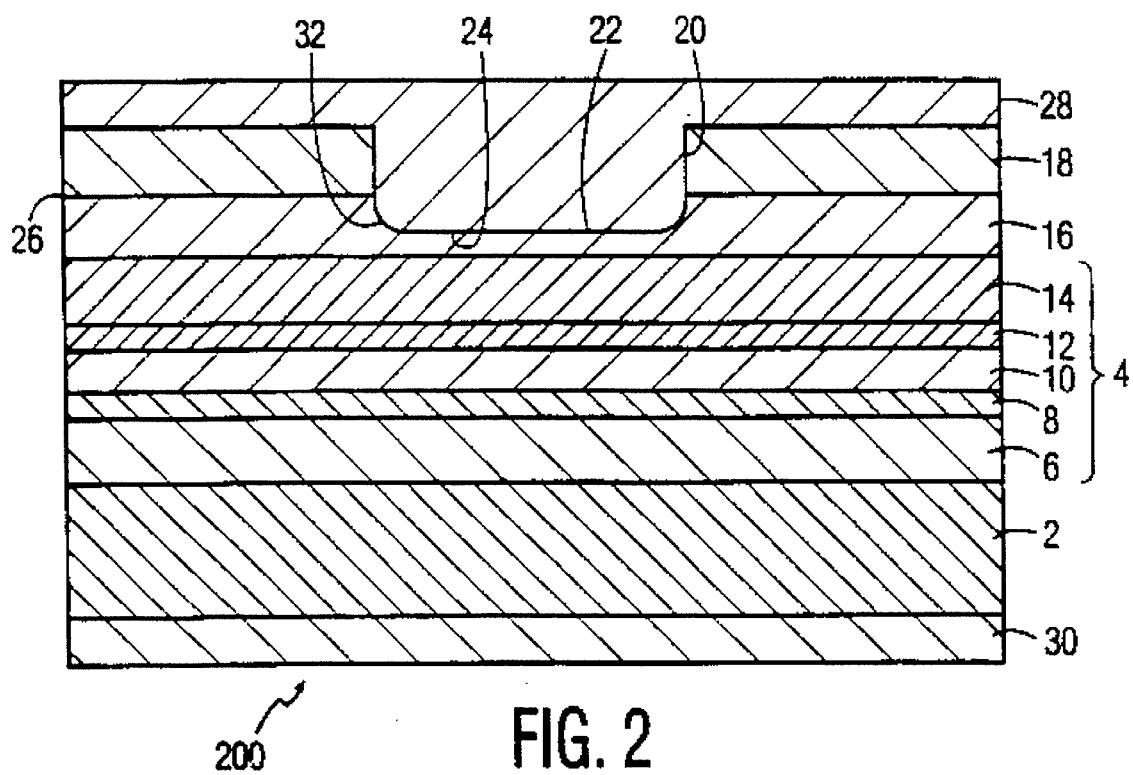
FIG. 2 is a cross-sectional view illustrating a further embodiment of the structure of a II-VI semiconductor diode laser which includes a II-VI semiconductor current-blocking layer and an etched groove in accordance with the invention.

A second embodiment of the invention is shown in FIG. 2. The layer structure of the II-VI semiconductor diode laser 200 is as described above with reference to FIG. 1 above. However, the groove 20 in this embodiment is etched slightly past the interface 26 and into the contact layer 16. Furthermore the groove has curved edges 32, which serve to reduce the high current densities that would typically occur at sharp edges.

In a further embodiment of the invention the current-blocking layer 18 is undoped, while the other layers have their respective doping as in the first embodiment. The undoped current-blocking layer in this embodiment will still confine the current flow to the etched groove area, even though the reverse-biased p-n junction between the current-blocking layer 18 and the contact layer 16 from the previous embodiments is absent.

In summary, the present invention provides a II-VI semiconductor diode laser having a current-blocking layer of II-VI semiconductor material with a groove etched therethrough.

The present invention is not limited to the embodiments shown, since many modifications and variations are possible to those skilled in the art within the scope of the invention. Thus different thicknesses, doping levels, different II-VI semiconductor materials for the II-VI layers in the semiconductor diode laser, or different materials for the substrate may be used. For example in the case of an active layer of ZnSe, ZnMgSSe can be used as the material for the wave guiding and the cladding layers. In that case the composition of ZnMgSSe in the respective layers should be such that the band gap of the guiding layers is smaller than the band gap of the cladding layers. In case of an active layer of ZnCdSe, ZnSe could also be used as the material for the wave guiding layers, with ZnSSe as the material for the cladding layers. Furthermore, the II-VI current blocking layer could, for example also be formed of ZnSSe or ZnMgSSe. It will also be clear that the conductivity types in the above embodiments may all be reversed simultaneously without departing from the spirit or scope of the invention.

Additionally, the present invention is not limited to the shown layer structure between the substrate 2 and the contact layer 16, so that, for example, separate wave guiding layers can be omitted around the active layer 10 without departing from the spirit or scope of the invention. This structure may be used in semiconductor diode lasers having a multilayer active layer of ZnCdSe and ZnSSe cladding layers, or lasers having a single ZnSe active layer having a thickness greater than 200 Å and ZnMgSSe cladding layers. It is further noted that if the substrate is of the same semiconductor material as the first cladding layer, the substrate may at the same time act as the first cladding layer, thereby eliminating the need for a separate first cladding layer, such as for example in II-VI semiconductor diode lasers having a multilayer active layer ZnCdSe and cladding layers of ZnSe on a substrate of the same material.

What is claimed is:

1. A II-VI semiconductor diode laser comprising:
   a substrate of semiconductor material of a first conductivity type;
   a II-VI semiconductor layer structure disposed atop said substrate, said II-VI semiconductor layer structure including:
      an active layer; and
      a first cladding layer of a second conductivity type, opposite to that of the first conductivity type, disposed atop the active layer;
   a contact layer of II-VI semiconductor material of said second conductivity type disposed atop an entire surface of the II-VI semiconductor layer structure;
   a current-blocking layer of II-VI semiconductor material disposed atop said contact layer, said current-blocking layer having a groove etched therethrough to expose a stripe of said contact layer; and
   a metal electrode layer contacting said current-blocking layer and extending into said groove to contact the stripe of said contact layer, said current-blocking layer confining current flow between the metal electrode layer and the contact layer to said stripe of said contact layer.

2. A semiconductor diode laser as claimed in claim 1, wherein said first conductivity type is n-type, and said second conductivity type is p-type.

3. A II-VI semiconductor diode laser as claimed in claim 1, wherein said first conductivity type is p-type, and said second conductivity type is n-type.

4. A II-VI semiconductor diode laser as claimed in claim 1, wherein said etched groove extends into the contact layer and has a flat bottom and curved edges.

5. A II-VI semiconductor diode laser as claimed in claim 1, wherein the current-blocking layer is of the first conductivity type, said first conductivity type being n-type and said second conductivity type being p-type.

6. A II-VI semiconductor diode laser as claimed in claim 1, wherein the current-blocking layer is of the first conductivity type, said first conductivity type being p-type and said second conductivity type being n-type.

7. A II-VI semiconductor laser as claimed in claim 1, wherein said II-VI semiconductor layer structure further comprises:
   a second cladding layer of the first conductivity type disposed on the side of the active layer opposite said first cladding layer;
   a first wave guiding layer of the second conductivity type disposed between the active layer and the first cladding layer; and
   a second wave guiding layer of the first conductivity type disposed between the active layer and the second cladding layer.

8. A II-VI semiconductor diode laser as claimed in claim 1, wherein said substrate is of III-V semiconductor material of the first conductivity type, and said II-VI semiconductor layer structure further comprises a second cladding layer of the first conductivity type disposed on the side of the active layer opposite said first cladding layer.

9. A II-VI semiconductor diode laser as claimed in claim 8, wherein said II-VI semiconductor layer structure further comprises:
   a first wave guiding layer of the second conductivity type disposed between the active layer and the first cladding layer; and
   a second wave guiding layer of the first conductivity type disposed between the active layer and the second cladding layer.

10. A II-VI semiconductor diode laser as claimed in claim 9, wherein said substrate comprises GaAs, said first and said second cladding layers comprise ZnMgSSe, said first and said second wave guiding layers comprise ZnSSe, said active layer comprises ZnCdSe, and said contact layer and said current blocking layer comprise ZnSe.

11. A II-VI semiconductor diode laser as claimed in claim 1, wherein said substrate comprises ZnSe, said first cladding layer comprises ZnSe, said active layer comprises ZnCdSe, and said contact layer and said current blocking layer comprise ZnSe.

12. A II-VI semiconductor diode laser as claimed in claim 1, wherein said metal electrode layer comprises Au.

13. A II-VI semiconductor diode laser as claimed in claim 1, wherein said current-blocking layer comprises ZnSe.

14. A II-VI semiconductor diode laser as claimed in claim 1, wherein said current-blocking layer comprises ZnSSe.

15. A II-VI semiconductor diode laser as claimed in claim 1, wherein said current-blocking layer comprises ZnMgSSe.

* * * * *